United States Patent [19]

Fan et al.

[11] Patent Number: 4,632,712

[45] Date of Patent: Dec. 30, 1986

[54] REDUCING DISLOCATIONS IN SEMICONDUCTORS UTILIZING REPEATED THERMAL CYCLING DURING MULTISTAGE EPITAXIAL GROWTH

[75] Inventors: John C. C. Fan, Chestnut Hill; Bor-Yeu Tsaur, Arlington; Ronald P. Gale, Bedford; Frances M. Davis, Framingham, all of Mass.

[73] Assignee: Massachusetts Institute of Technology, Cambridge, Mass.

[21] Appl. No.: 678,364

[22] Filed: Dec. 4, 1984

Related U.S. Application Data

[63] Continuation of Ser. No. 531,549, Sep. 12, 1983, abandoned.

[51] Int. Cl.[4] .................. H01L 21/20; H01L 21/322; H01L 21/324
[52] U.S. Cl. .................. 148/175; 29/576 E; 29/576 T; 148/1.5; 148/174; 148/DIG. 3; 148/DIG. 25; 148/DIG. 97; 156/612; 357/60
[58] Field of Search .......... 148/174, 175, 1.5, DIG. 3, 148/DIG. 97, DIG. 25; 156/612; 357/60; 29/576 T, 576 E

[56] References Cited

U.S. PATENT DOCUMENTS

3,729,348 4/1973 Saul .......................... 148/DIG. 97
3,862,859 1/1975 Ettenberg et al. .............. 148/175 X
3,963,538 6/1976 Broadie et al. ................. 148/175

OTHER PUBLICATIONS

Berkenblit et al, "Reduction of Stress in Single Crystal ... Layers", IBM Tech. Discl. Bull., vol. 12, No. 9, Feb. 1970, p. 1489.
Kemlage, B. M., "Deposition of Gap Heteroepitaxy on Silicon", IBM Tech. Discl. Bull., vol. 18, No. 6, Nov. 1975, p. 1852.
Bratter et al., "Epitaxial Deposition Process", IBM Tech. Discl. Bull., vol. 15, No. 2, Jul. 1972, p. 684.
Tsaur et al., "Efficient GaAa/Ge/Si Solar Cells", Conf. Rec., 16th IEEE Photovoltaic Spec. Conf., San Diego, Calif., Sep. 27-30, 1982, pp. 1143-1148.

*Primary Examiner*—William G. Saba
*Attorney, Agent, or Firm*—Thomas J. Engellenner; James E. Maslow

[57] ABSTRACT

Dislocation densities are reduced in growing semiconductors from the vapor phase by employing a technique of interrupting growth, cooling the layer so far deposited, and then repeating the process until a high quality active top layer is achieved. The method of interrupted growth, coupled with thermal cycling, permits dislocations to be trapped in the initial stages of epitaxial growth.

10 Claims, 8 Drawing Figures

INITIAL GROWTH

• THREADING OF DISLOCATIONS

INTERRUPTS

• STRESS-INDUCED DISLOCATION MOVEMENT

• INTERACTION OF DISLOCATIONS TO FORM LOOPS OR NETWORKS

SUBSEQUENT GROWTH

• THREADING OF DISLOCATIONS

4,632,712

REDUCING DISLOCATIONS IN SEMICONDUCTORS UTILIZING REPEATED THERMAL CYCLING DURING MULTISTAGE EPITAXIAL GROWTH

The U.S. Government has rights in this invention pursuant to Air Force Contract F19628-80-C-0002 and the Department of Energy's Solar Energy Research Institute Contract XZ-0-9158-1.

This application is a continuation of application Ser. No. 531,549, filed Sept. 12, 1983.

TECHNICAL FIELD

This invention is in the field of materials and more particularly relates to the production of sheets, films or layers of crystalline material and in particular, semiconductor crystalline material useful in integrated circuits, solar cells and discrete devices.

BACKGROUND OF THE INVENTION

Attention is directed to an article by the inventors and a colleague entitled "Efficient GaAs/Ge/Si Solar Cells" in the *Proceedings of the Sixteenth IEEE Photovoltaics Specialists Conference*, pp. 1143–1148 (September 1982) and an article by Fan et al. entitled "Optimal Design of High Efficiency Tandem Cells" from the same proceedings at pp. 692–701; both articles are incorporated herein by reference.

By way of initial definition it should be noted that much of modern semiconductor technology makes use of thin solid films on the surfaces of solid substrates. A number of methods have been used to deposit such thin films including thermal evaporation, DC sputtering, RF sputtering, ion beam deposition, chemical vapor deposition, plating, molecular beam deposition and deposition from the liquid phase.

The structure of thin films can be amorphous (that is, the film is composed of many small regions, in each of which the atoms are arranged in a regular crystalline order, but the small regions have no mutual alignment of their crystallographic axes), textured-polycrystalline (that is, the film is composed of many small regions, in each of which the atoms are arranged in a regular crystalline order, and one or more of the crystalline axes of the majority of said regions are parallel), or epitaxial (that is, the film is predominantly of a single crystallographic orientation). An epitaxial or nearly single crystal film is a special case of a preferred orientation film in which corresponding crystallographic axes of all the small regions are essentially oriented in the same directions. A thin film can be the same material (that is, the same element or compound) as the substrate (producing a "homogeneous" structure), or it can differ in chemical composition from the substrate (producing a heterogeneous structure). If the film is epitaxial, the former is called "homoepitaxy" and the latter "heteroepitaxy".

By "crystallization" is meant the process of arranging the atoms of a substance in a crystalline order. For convenience, the term should also be understood to encompass "recrystallization" as well, when referring to a substance which already has some degree of crystalline order, in which case, the atoms are arranged in a higher crystalline order by "recrystallization".

In the pursuit of low-cost, efficient solar cells, for example, there is currently strong interest in depositing various semiconductor films on low-cost substrates. However, when the total costs of photovoltaic systems are considered, the balance of system costs are normally so high that highly-efficient cells are preferred. In other applications, such as semiconductor lasers and integrated circuits, high quality semiconductor layers are also needed.

Because of cost and efficiency consideration, one is frequently confronted with trying to deposit high-quality semiconductor layers on substrates significantly different from the layer, in crystal structure, lattice constants and thermal expansions—factors which are instrumental in determining whether good layers can be obtained. The most critical problem of growing such layers on dissimilar substrates is the lattice mismatch between the materials, which causes a large density of dislocations in the resultant grown layers. To reduce the dislocation densities, various ideas have been proposed, ranging from graded interface alloys (for example see J. C. C. Fan, C. O. Bozler and R. W. McClelland, Proc. of 15th IEEE Photovoltaic Specialists Conf., June 1981, Florida, p. 666 and U.S. Pat. No. 4,357,183 issued to Fan et al.) to superlattice techniques (for example, see K. W. Mitchell, Proc. of 15th IEEE Photovoltaic Specialists Conf., June 1981, Florida, p. 142).

In U.S. Pat. No. 4,246,050 a method is disclosed for growing crystalline layers from the liquid phase employing a stepwise cooling procedure such that dislocation defects are more uniformly distributed over the surface of the growing layer.

While the proposals for reducing dislocations have varying degrees of merit, there still exists a need for simple methods for reducing dislocation densities in grown layers, particularly in crystalline layers grown from a vapor phase.

SUMMARY OF THE INVENTION

We have discovered that dislocation densities can be reduced in growing semiconductors and the like from the vapor phase by employing a technique of interrupting growth, cooling the layer so far deposited, and then repeating the process until a high quality active top layer is achieved. Our method of interrupted growth, coupled with thermal cycling, permits dislocations to be trapped in the initial stages of epitaxial growth.

At the beginning of the growth process, a lot of dislocations, caused by lattice mismatch at the epitaxial substrate interface thread themselves into the epitaxial layer. In our invention, after an initial stage of growth, the process can be stopped, and the sample cooled. Since the thermal coefficients of expansion of the epitaxial layer and substrate are different, the epitaxial layer is subjected to significant stress, causing stress-induced dislocation movement to form loops or networks. Upon subsequent growth, the dislocation networks greatly reduced the dislocations from threading into the second epitaxial layer. By repeating the steps of interrupted growth and the associated thermal cycling, more and more dislocations can be induced to form loops, without threading into subsequent layers.

Our invention will next be described in connection with certain preferred embodiments, such as the growth of GaAs layers on silicon for solar cells; however, it should be clear that various changes and modifications can be made by those skilled in the art without departing from the spirit or scope of our invention. For example, a wide variety of materials may be processed by our technique, i.e., GaAs/Si, GaAlAs/Si, CdTe/Si, GaP/InP, GaAs/InP, GaAsP/Si, Ge/InP, Si/InP. Deposition of intermediate layers, such as germanium, between the substrate and the active layer may be used in conjunction with our method to further reduce the propagation of defects. Additionally, the processing temperature and the degree of cooling may be varied depending upon the materials used. Essentially, our invention resides in a vapor growth technique that uses stress induced by differential thermal expansion between two dissimilar semiconductor materials to greatly reduce dislocations that are formed from the lattice mismatch between the two materials. Our invention may be used in many other applications in addition to solar cell applications. For example, our invention may have great impact in combining electrooptical devices with silicon integrated circuits. For instance, GaAs semiconductor lasers may be fabricated on silicon integrated circuits, thus allowing rapid communication between integrated circuit chips. The ability to grow high quality layers of dissimilar materials on each other opens a novel device area, whereby previously impossible device structures can be made.

DESCRIPTION OF PREFERRED EMBODIMENTS

Our particular example will be the growth of GaAs layers on Si substrates, although the basic idea should be applicable to many other material combinations. Our primary motivation for investigating Si as a substrate material for GaAs growth has been to lower the cost of efficient GaAs solar cells, which have attained conversion efficiencies exceeding 20% (AM1). These cells employ an n+/p/p+ structure prepared by chemical vapor deposition (CVD) on either GaAs or Ge substrates. A major reduction in cost would be achieved if such cells could be produced on inexpensive Si sheets that are currently being developed for low-cost Si cells. In addition, the development of monolithic GaAs/Si integrated circuits will require the preparation of GaAs epilayers on Si. However, attempts to grow such epilayers directly on Si by CVD have been largely unsuccessful because of difficulties in nucleation, which are also encountered in GaP deposition on Si. We have overcome these difficulties by coating Si substrates with a thin epitaxial film of Ge before GaAs deposition. Since Ge and GaAs have almost the same lattice constant, this procedure also has the advantage of locating the lattice mismatch at the Ge-Si interface, away from the GaAs layer. The lattice mismatch at Ge-Si interface is large (about 4%) since Si has a lattice constant of about 5.43 angstroms, and GaAs has a lattice constant of 5.65 angstroms (see Table 1 for a partial list of other materials that can be grown by our invention, together with their lattice constants and coefficients of expansion).

TABLE 1

| Properties | Properties of Some Selected Electronic Materials | | | | | | | |
|---|---|---|---|---|---|---|---|---|
| | GaAs | Ge | Si | InP | ZnSe | CdTe | GaAlAs | GaP |
| Lattice Constants (angstroms) | 5.653 | 5.657 | 5.431 | 5.87 | 5.66 | 6.48 | 5.6–5.7 | 5.45 |
| Linear Coefficient of Thermal Expansion ($\Delta L/L)/\Delta T$ ($\times 10^{-6} K^{-1}$) | 6.7 | 6.7 | 3.7 | 4.5 | 6.8 | 4.9 | about 7 | 5.8 |

Figure 1:
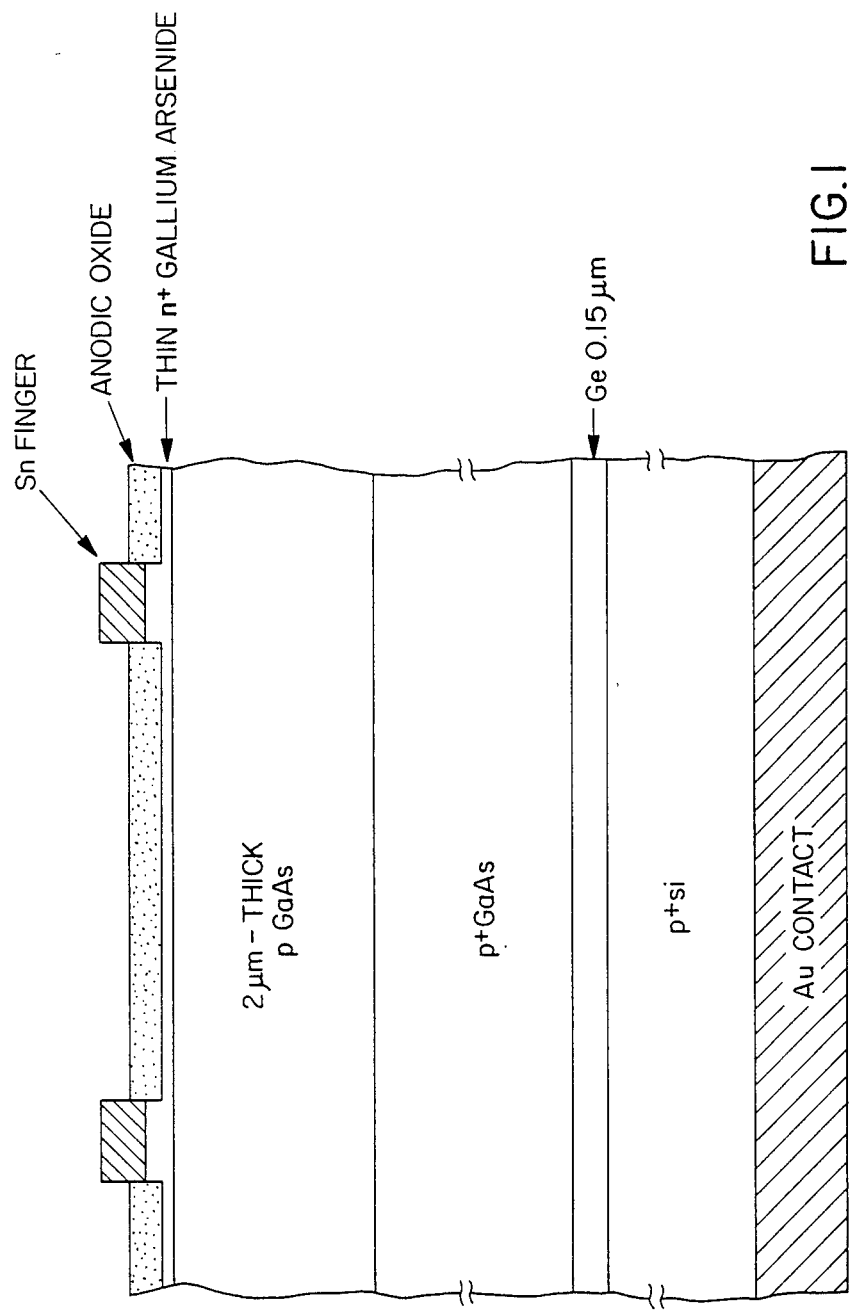
FIG. 1 is a schematic, cross-sectional view of a solar cell structure formed by the method of our invention.

The structure of a GaAs shallow-homojunction cell is shown schematically in FIG. 1. Electron-beam evaporation was reduced to deposit Ge films 0.1–0.2 microns thick on p+ Si substrates oriented 2 degrees off (001) towards {110}. An AsCl$_3$GaAs—H$_2$ system was then used to deposit GaAs epilayers at 680 degrees C. on the Ge films. Each layer consisted of n+ (S about $5 \times 10^{18}$ cm$^{-3}$), p(Zn about $1 \times 10^{16}$ to $1 \times 10^{17}$ cm$^{-3}$), and p+(Zn about $5 \times 10^{18}$ cm$^{-3}$) regions that were respectively 0.15, 2.0, and 4–12 microns thick.

GaAs epilayers with mirror-smooth surfaces have been readily obtained. Measurements of the Rutherford back-scattering of 2—MeV He+ ions in the channeling mode show that the layers are of reasonably good crystal quality. Transmission electron microscope (TEM) observations indicate a dislocation density of about $10^7$ cm$^{-2}$ to $10^8$ cm$^{-2}$, but no twins or stacking faults are detected.

The fabrication techniques used for the solar cells were similar to those used for GaAs cells on single-crystal Ge substrates. No vacuum processing procedures were employed. The back contact to the p+ Si substrate was electroplated Au, and the front contact bar and fingers (defined by photolithography) were electroplated Sn. The thickness of the n+ layer was reduced from its initial value of 1500 angstroms to about 500 angstroms by alternating anodic oxidation and oxide removal steps. The last of these steps was an anodization that formed an oxide layer about 850 angstroms thick to serve as an antireflection coating. The cell areas, which were defined by conventional mesa techniques, ranged from 0.2 to 9.3 mm$^2$.

A high-pressure Xe lamp with a water filter was used as a simulated AM1 source, calibrated with a NASA-measured GaAs reference solar cell. The open-circuit voltage for the best 9.3 mm$^2$ cells V$_{oc}$ is 0.76 V, the short-circuit current density J$_{sc}$ is 24.4 mA/cm$^2$ (not corrected for contact finger area), and the fill factor is 0.63, giving a measured efficiency of 11.7%. Other 9.3 mm$^2$ cells had values of V$_{oc}$ between 0.7 and 0.75 V, with similar J$_{sc}$'s and fill factors. Smaller cells had fill factors in the range 0.70 to 0.75. As a comparison, for our best cells on single-crystal bulk Ge substrates, V$_{oc}$=0.99 V, J$_{sc}$=25 mA/cm$^2$, and the fill factor is 0.82 at AM1.

Figure 2:
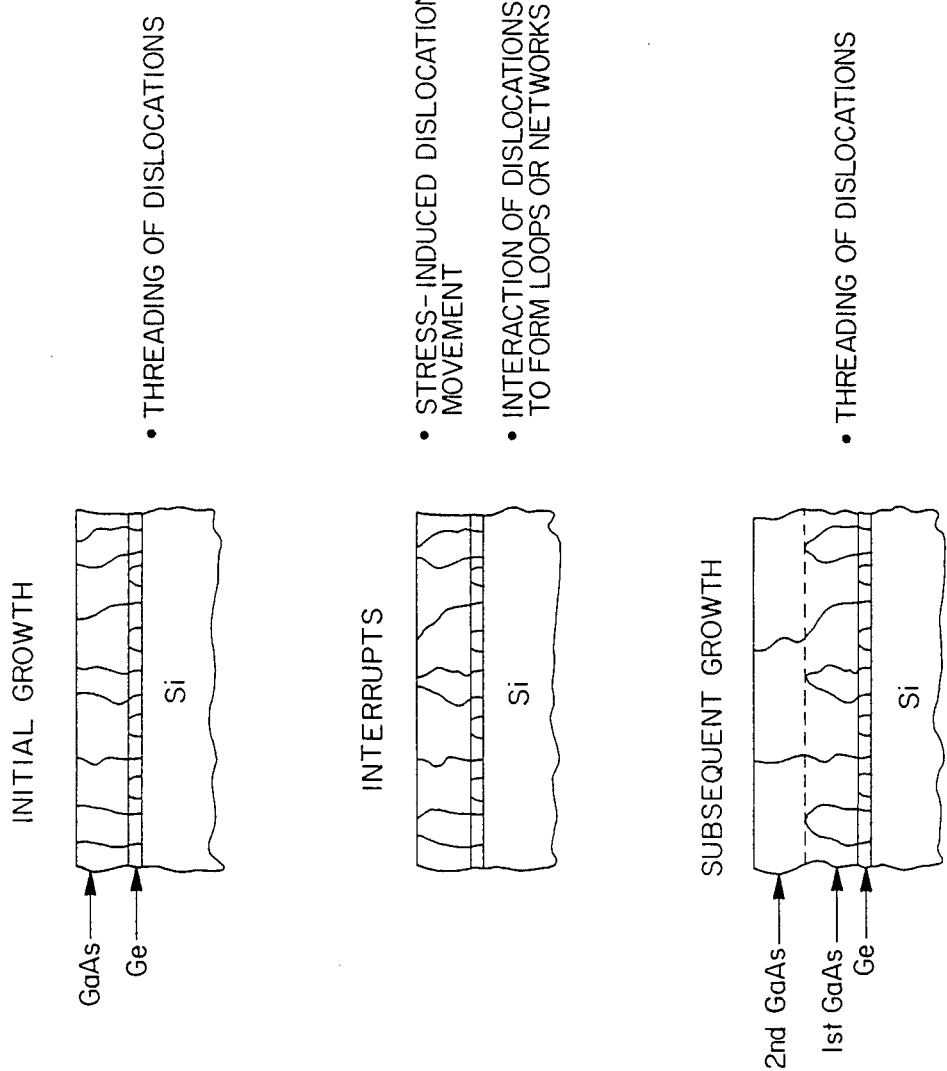
FIG. 2 is a schematic illustration of our invention in practice.

The basic idea of our new growth technique is shown in FIG. 2. In the initial growth, a lot of dislocations, caused by lattice mismatch between Ge-Si interface, are threading into the GaAs layer. After growth GaAs of about 0.1 microns, at a growth temperature of about 700 degrees C., the growth was stopped, and the sample was cooled to about room temperature. Since the thermal coefficients of expansion of GaAs and Si were very different (see Table 1), the GaAs layer was subjected to significant stress, causing stress-induced dislocation movement to form loops or networks as shown in FIG. 2. Upon subsequent growth, the dislocation networks greatly reduced the dislocations from threading into the second and subsequent GaAs layers. By repeating the number of interrupted growth, with the associated thermal cycling, the dislocations can be induced to form loops, without threading into subsequent layers.

Figure 3:
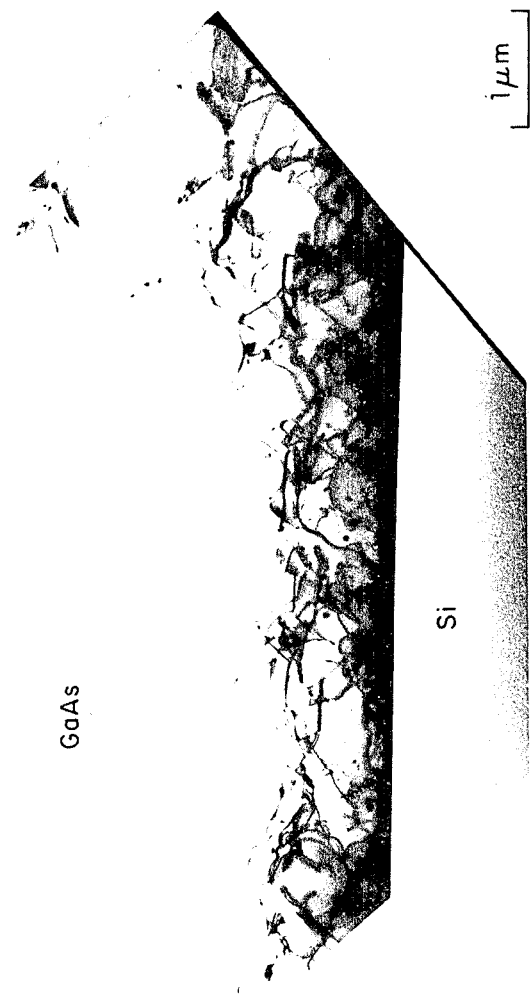
FIG. 3 is a transmission electron micrograph of a GaAs layer grown according to our invention.
Figure 4:
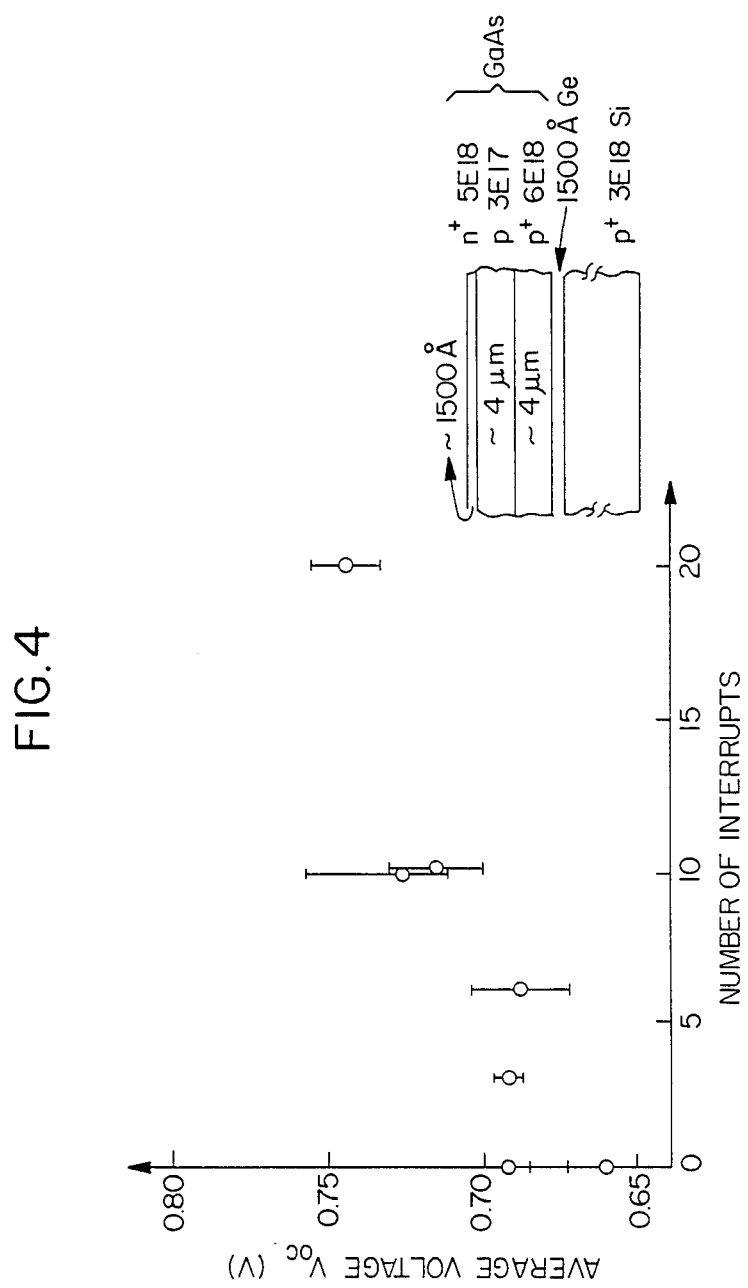
FIG. 4 is a graph of performance of solar cells formed by practicing our invention to varying degrees.
Figure 5:
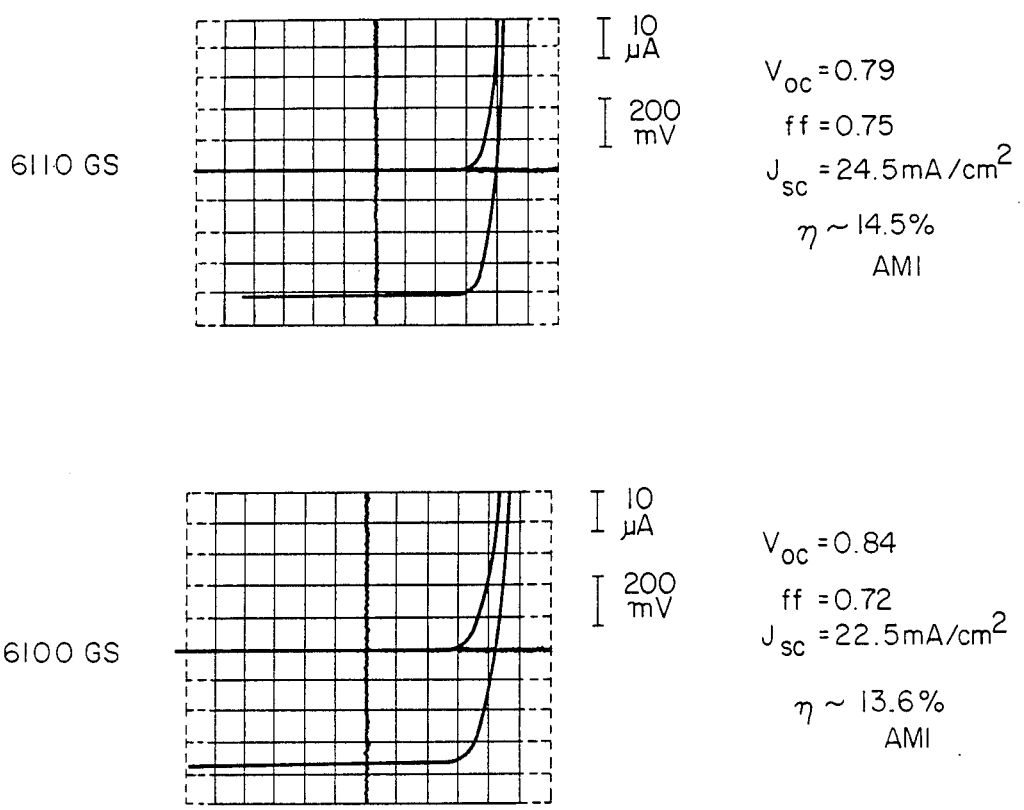
FIG. 5 is a graph of I—V curves for two solar cells fabricated in accordance with our invention.

FIG. 3 shows a cross-section transmission electron micrograph of a GaAs sample deposited on Ge-coated Si substrates with ten interrupted growths and thermal cycles. Almost all the dislocations were found to tie together into layers and loops, without propagating into the top active GaAs layers. The solar cell properties were also found to improve with the number of cycles. FIG. 4 shows the average open-circuit voltage $V_{oc}$ of small mesa cells as a function of interrupts and thermal cycles. The $J_{sc}$ of these cells are about the same (about 14 mA/cm$^2$)—these cells have relatively thick n+ layers (about 1500 angstroms) and have no antireflection coatings. The $V_{oc}$ value increased from about 0.65 to 0.70 V with no thermal cycles to about 0.75 V with ten or twenty thermal cycles. After the n+ layers were thinned (by anodization and stripping) to about 500 to 600 angstroms, and after anodic AR coatings were put on the cells, the $V_{oc}$ values ranged from 0.7 to 0.75 V for no thermally-cycled samples, and from 0.80 to 0.85 V for ten and twenty thermally-cycled samples. FIG. 5 shows the I—V curves of two small-area cells that were fabricated on GaAs layers grown with ten thermal cycles. These two cells were fabricated with Sn front contacts, Au back contacts, and anodic antireflection coatings. The efficiency values at AM1 were 13.6% and 14.5% respectively.

EQUIVALENTS

Although our work has been described in connection with certain preferred embodiments, it should be clear that various changes and modifications can be made without departing from the spirit and scope of the claimed invention. For example, a wide variety of materials in addition to those mentioned specifically herein may be grown into high quality crystalline films. Generally, our invention will be useful in growing so-called III—V compounds and II—VI compounds, among others as films. Additionally, while the thermal cycling disclosed herein to induce stress and thus trap dislocations is typically accomplished by cooling the deposited portion, thermal stress in other applications may also be induced by heating, or by a combination of heating and cooling.

What we claim is:

1. A method of forming a semiconductor material as an epitaxial layer upon a dissimilar substrate with a reduced number of dislocations in the material, the method comprising:
    (a) depositing from a vapor phase a portion of the material upon the substrate;
    (b) changing the temperature of the deposited portion without substantial melting or plastic deformation of the deposited portion to induce stress therein and thereby trap dislocations;
    (c) depositing another portion of the material; and
    (d) repeating the steps of changing the temperature and depositing further portions of the material until a reduction in dislocations is achieved.

2. The method of claim 1 wherein the method further comprises first coating the substrate with a coating to further insulate the forming material from the effects of substrate lattice.

3. The method of claim 1 wherein the step of depositing the material on the dissimilar substrate further comprises depositing the material on a silicon substrate.

4. The method of claim 3 where the step of depositing the material further comprises depositing a III—V compound onto the silicon substrate.

5. The method of claim 4 wherein the step of depositing a III—V compound further comprises depositing a compound chosen from the group of GaAs, GaAlAs, and GaAsP onto the silicon substrate.

6. The method of claim 3 wherein the step of depositing the material further comprises depositing a II—VI compound onto the silicon substrate.

7. The method of claim 6 wherein the step of depositing the material further comprises depositing CdTe onto the silicon substrate.

8. The method of claim 1 wherein the step of depositing a material on the dissimilar substrate further comprises depositing the material onto an InP substrate.

9. The method of claim 1 wherein the step of depositing the material further comprises depositing a material chosen from the group of GaP, GaAs, Ge and Si onto the InP substrate.

10. The method of claim 2 wherein the step of first coating the substrate further comprises coating the substrate with a germanium coating.

* * * * *